United States Patent [19]
Van Doren et al.

[11] Patent Number: 5,700,046
[45] Date of Patent: Dec. 23, 1997

[54] WAFER GRIPPER

[75] Inventors: Matthew J. Van Doren, Pleasanton; Don Sauer, San Jose, both of Calif.; Alexander H. Slocum, Concord, N.H.; David Pap Rocki, Pleasanton, Calif.; Johann Tam, Mountain View, Calif.; Larry Gerszewski, Sunnyvale, Calif.

[73] Assignee: Silicon Valley Group, Inc., San Jose, Calif.

[21] Appl. No.: 527,796

[22] Filed: Sep. 13, 1995

[51] Int. Cl.⁶ ................................................. B25J 15/08
[52] U.S. Cl. .................... 294/119.1; 294/902; 414/941; 901/39
[58] Field of Search ................ 294/1.1, 16, 27.1, 294/31.1, 32, 34, 67.33, 103.1, 119.1, 902; 118/500, 503; 414/935–939, 941; 901/36–39

[56] References Cited

U.S. PATENT DOCUMENTS

| | | |
|---|---|---|
| 3,982,627 | 9/1976 | Isohata . |
| 4,376,482 | 3/1983 | Wheeler et al. . |
| 4,407,627 | 10/1983 | Sato et al. . |
| 4,457,664 | 7/1984 | Judell et al. . |
| 4,662,811 | 5/1987 | Hayden . |
| 4,819,167 | 4/1989 | Cheng et al. . |
| 4,846,626 | 7/1989 | Engelbrecht . |
| 4,892,455 | 1/1990 | Hine ............................. 414/937 X |
| 4,900,214 | 2/1990 | Ben . |
| 4,904,153 | 2/1990 | Iwasawa et al. . |
| 4,944,650 | 7/1990 | Matsumoto . |
| 4,955,780 | 9/1990 | Shimane et al. . |
| 4,971,512 | 11/1990 | Lee et al. . |
| 5,052,886 | 10/1991 | Moroi . |
| 5,061,144 | 10/1991 | Akimoto et al. ................ 294/32 X |
| 5,080,415 | 1/1992 | Bjornson ...................... 294/119.1 |
| 5,171,031 | 12/1992 | Nishiyama . |
| 5,183,378 | 2/1993 | Asano et al. . |
| 5,188,501 | 2/1993 | Tomita et al. . |
| 5,192,106 | 3/1993 | Kaufman ........................ 294/16 X |
| 5,261,776 | 11/1993 | Burck et al. . |
| 5,308,222 | 5/1994 | Bacchi et al. . |
| 5,340,261 | 8/1994 | Oosawa et al. . |
| 5,518,542 | 5/1996 | Matsukawa et al. ........... 414/941 X |
| 5,549,444 | 8/1996 | Dubuit ......................... 414/941 X |

FOREIGN PATENT DOCUMENTS 55342  3/1993  Japan ........................... 414/941

OTHER PUBLICATIONS

Van Doren, Matthew J., Precision Machine Design for the Semiconductor Equipment Manufacturing Industry, Massachusetts Institute of Technology, May 1995.

*Primary Examiner*—Johnny D. Cherry
*Attorney, Agent, or Firm*—William B. Walker

[57] ABSTRACT

A wafer gripper assembly comprises first and second gripping members movably supported relative to each other. A motor propels the gripping members linearly towards and away from each other. Preferably both gripping members are movably supported, and a rotary-to-linear translator produces equal and opposite linear movement of the gripping members. Typically, at least six contactor elements are defined on the pair of gripping members. The contactor elements include a vertically extending portion having an inwardly facing convex surface for contacting an edge of a wafer, and an inwardly extending flange for supporting a lower surface of the wafer.

8 Claims, 6 Drawing Sheets

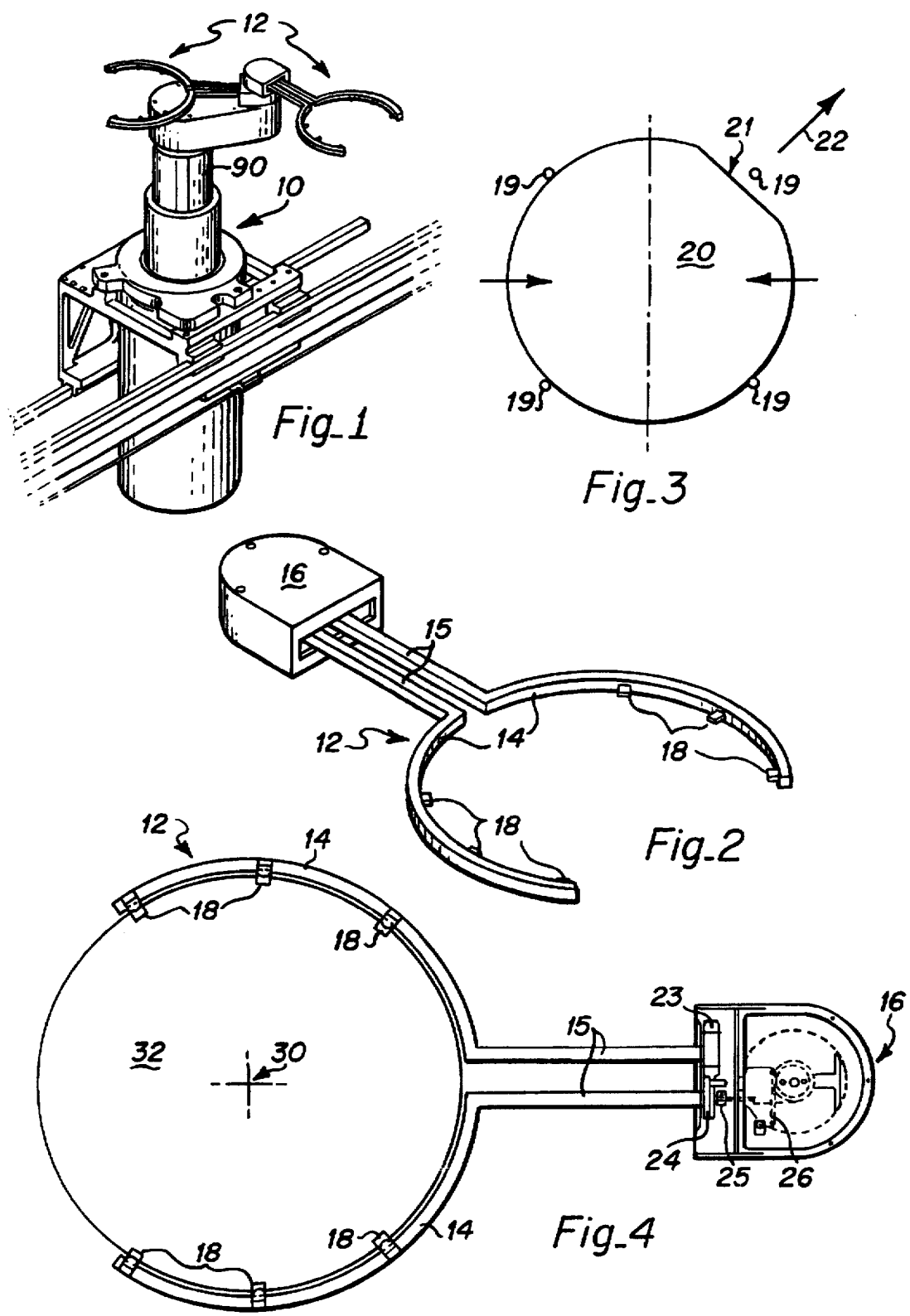

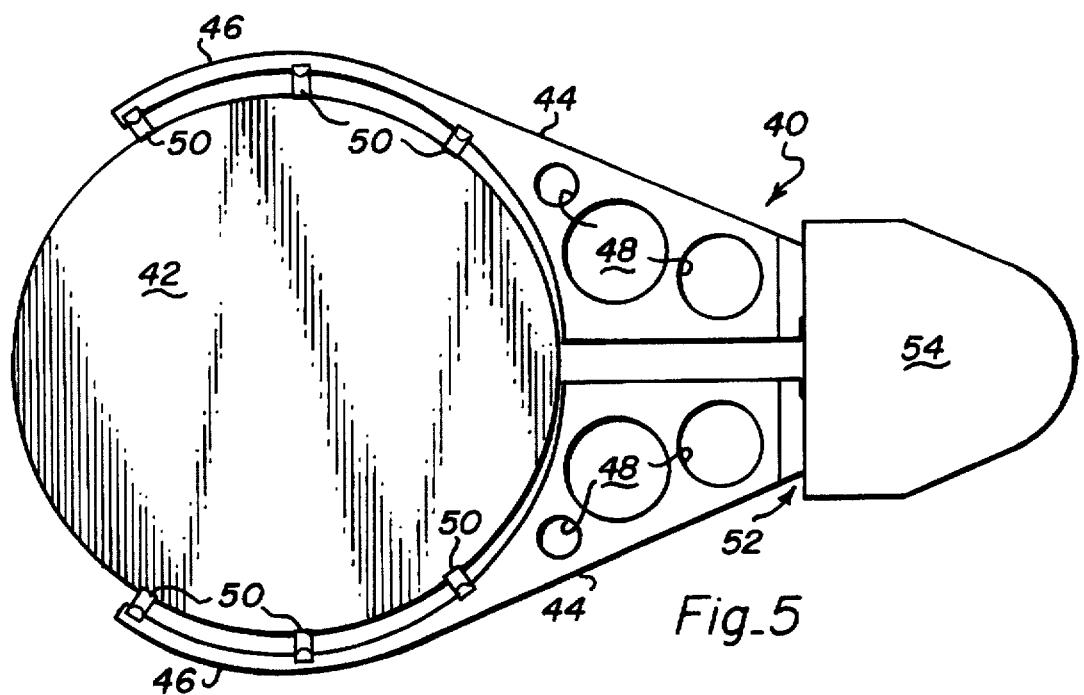
Fig_5
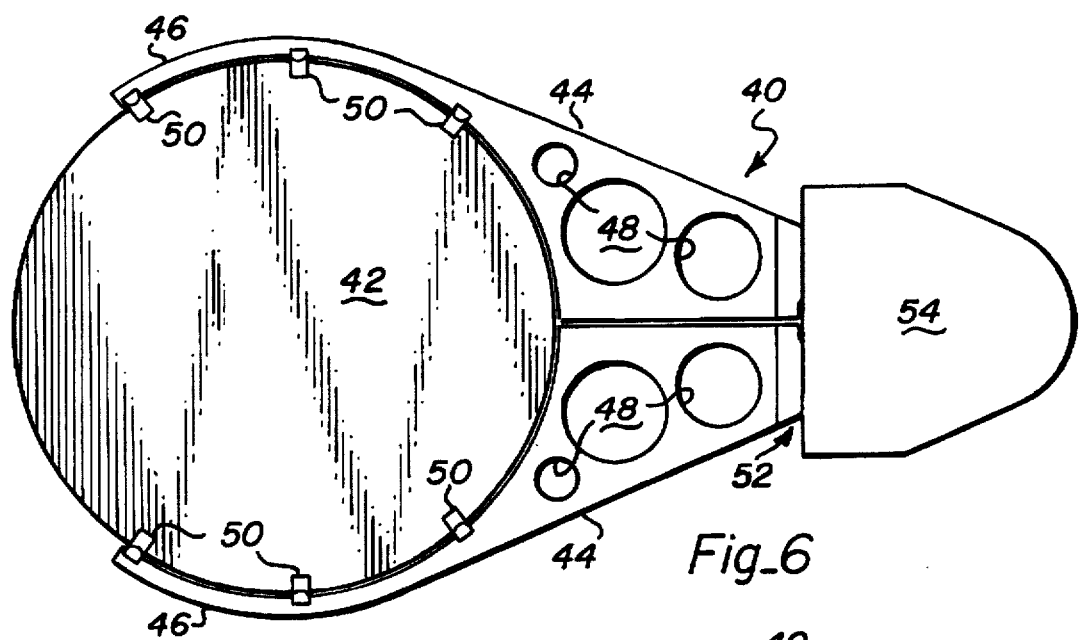
Fig_6
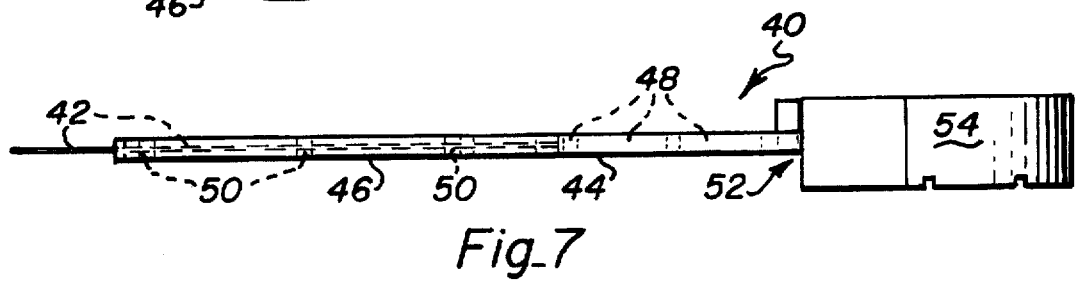
Fig_7

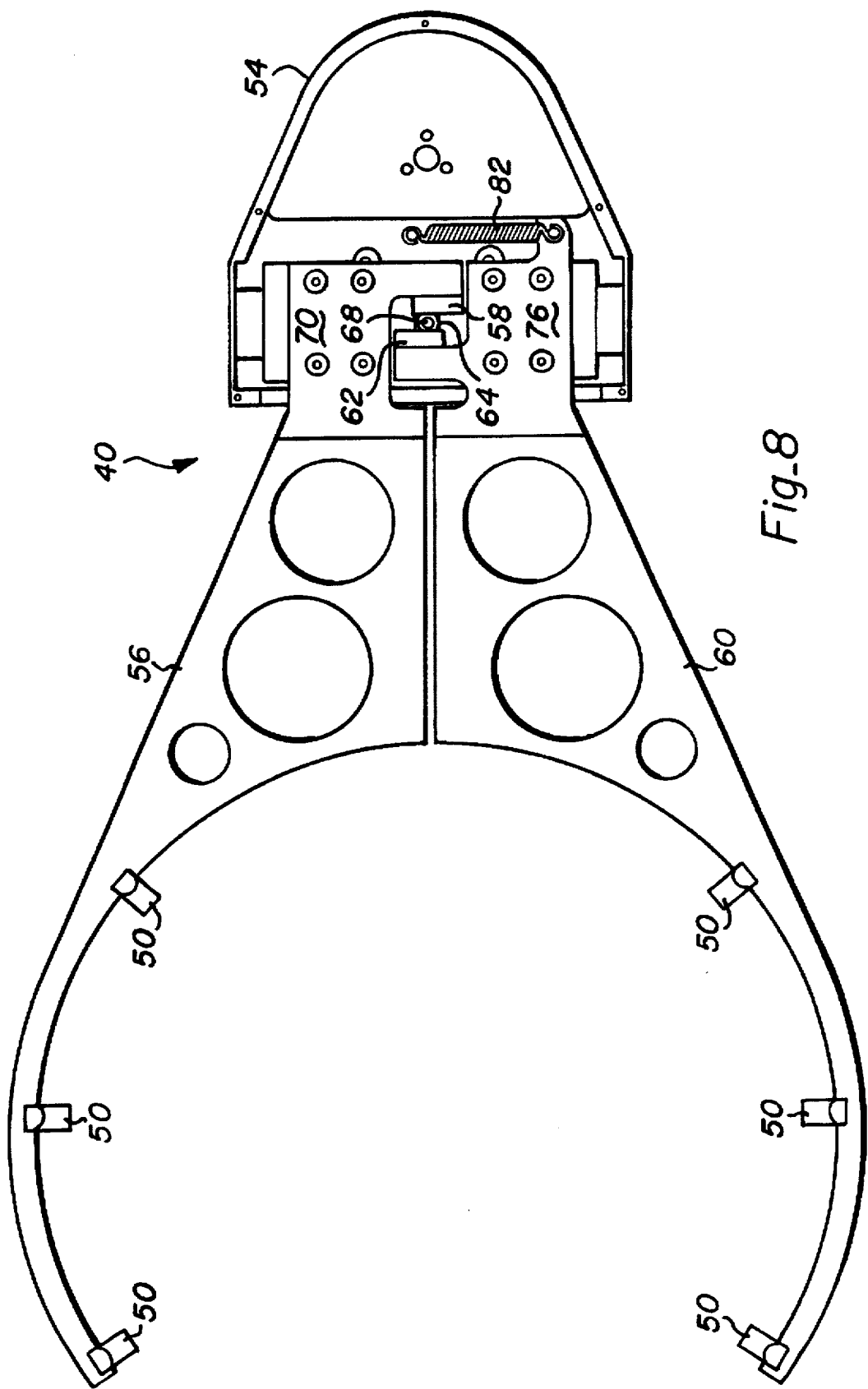
Fig_8

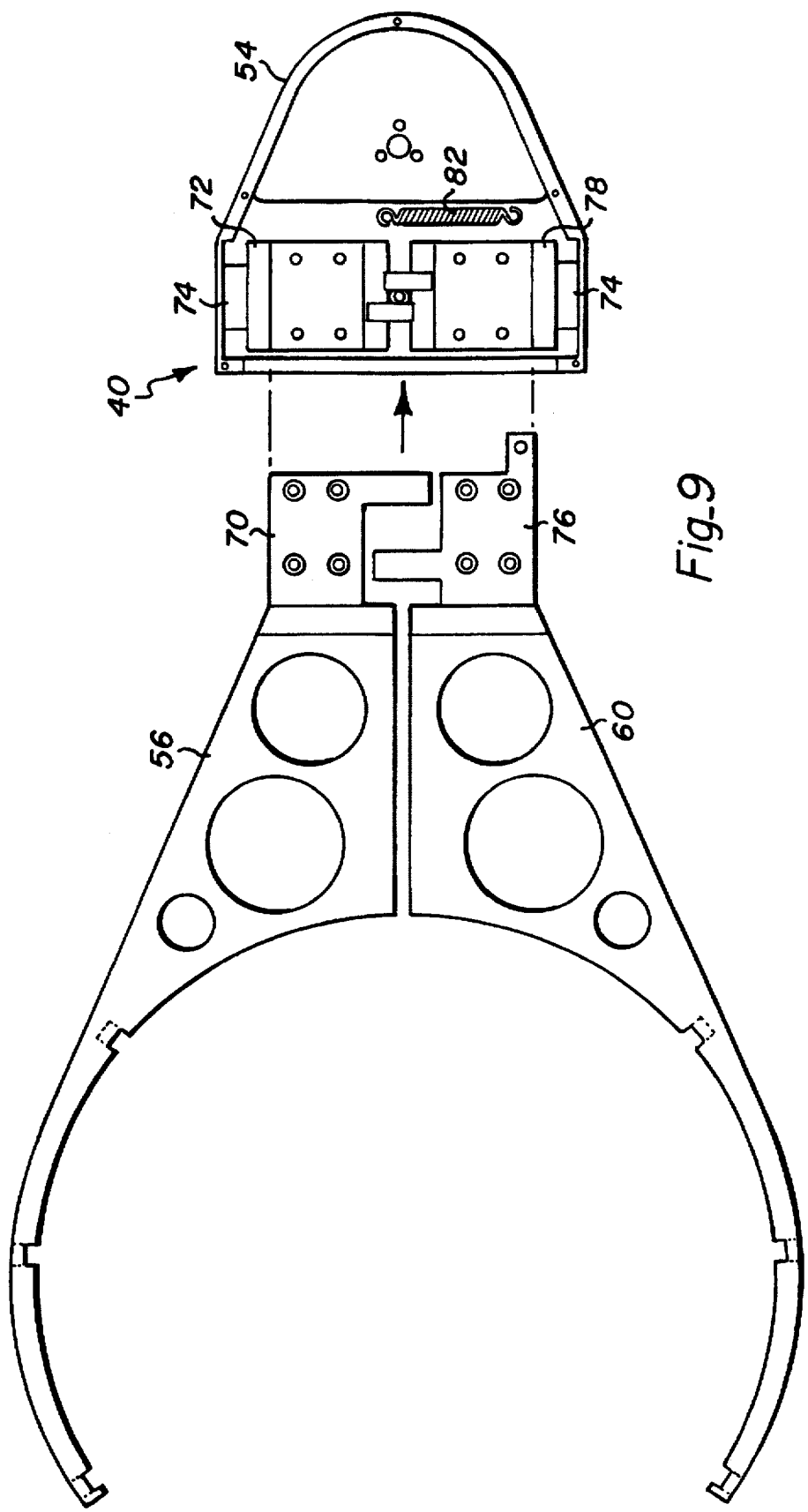

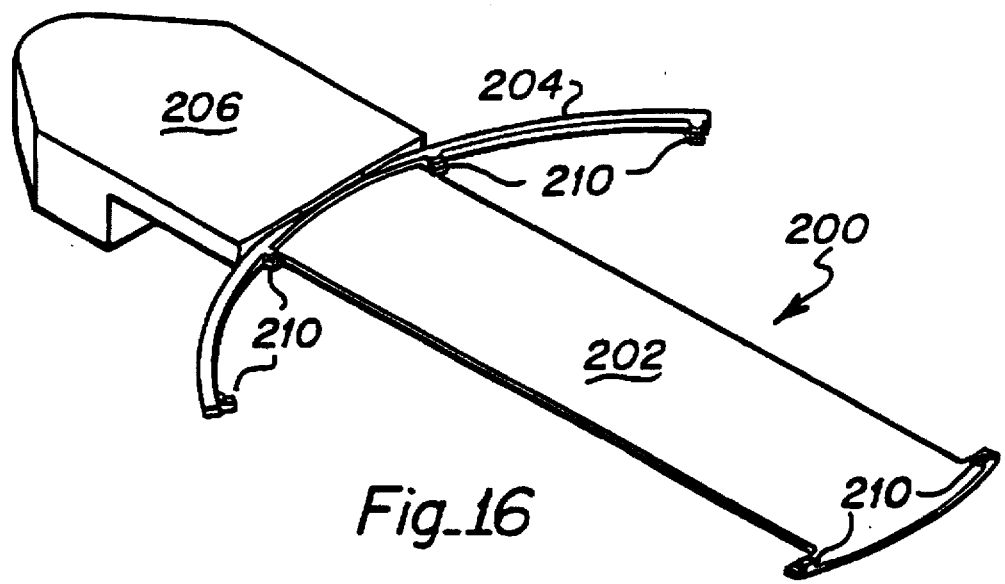
Fig_16
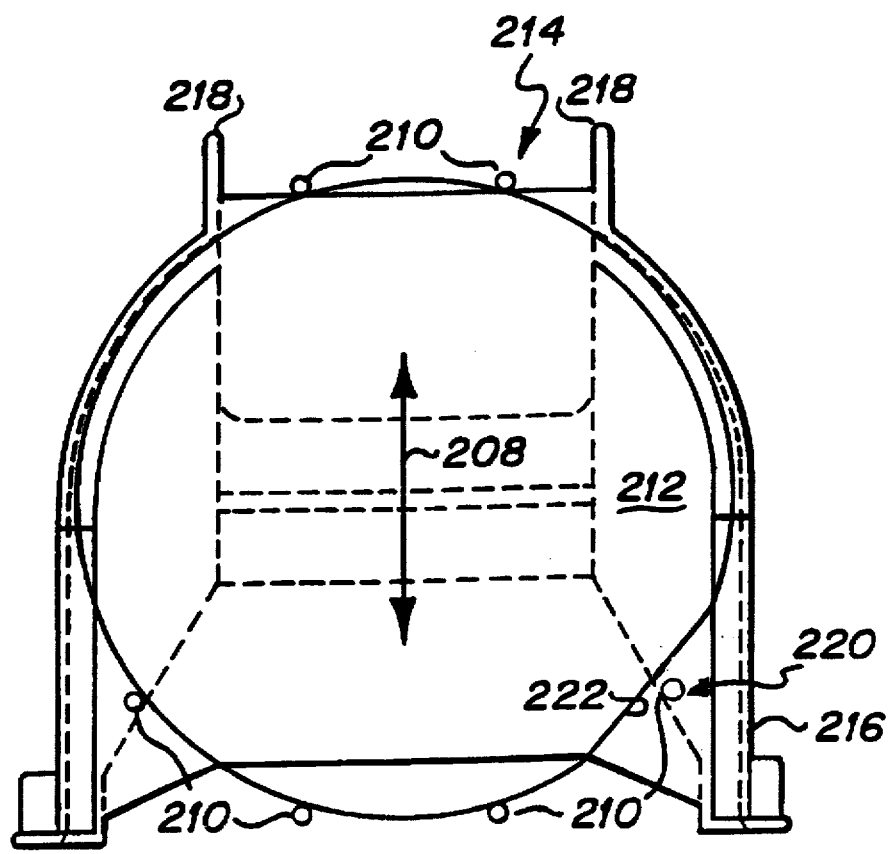
Fig_17

WAFER GRIPPER

FIELD OF THE INVENTION

The invention relates to a gripper mechanism for semiconductor wafers.

BACKGROUND OF THE INVENTION

The operation of some semiconductor process tools, such as photoresist processing systems, require that wafers be centered with a high degree of accuracy prior to commencing the processing operation. In known devices, this centering operation is performed by a mechanism located within the process module which performs no transporting function. Typically, light sensors have been used to center wafers. One such device is described in U.S. Pat. No. 4,819,167 to Cheng et al. To avoid the need for light sensors, mechanical wafer centering devices have been developed. Such a device is described in U.S. Pat. No. 5,171,031 to Nishiyama. Again, the Nishiyama centering mechanism is located within the process module. The wafer is supported on a chuck, and a plurality of moveable stops are disposed with even angular spacing around the center of the chuck. The stops are moveable radially towards and away from the center thereby to clamp the periphery of a wafer located on the chuck. The centering mechanism does not perform a transporting function and further involves a complicated mechanism to facilitate the simultaneous radial movement of the six stops. Wafer transporter devices presently available, while capable of accommodating a variety of wafer diameters, do not have the ability of accurately centering the wafer. In particular, U.S. Pat. No. 4,971,512 to Lee et al. and U.S. Pat. No. 4,900,214 to Ben disclose "tongue" gripper arrangements having a pair of gripping members. The Ben patent discloses single contact points between the wafer surface and each gripper element. No account is taken of the fact that the wafer has an irregular surface and may have a flat section or notch. The Lee patent discloses two contact points on each gripper element. This fails to take account of notches or flat portions on the wafer, which can affect wafer centering accuracy. The present invention seeks to provide a gripper mechanism which avoids the problems of the prior art.

OBJECTS AND SUMMARY OF THE INVENTION

It is an object of the invention to provide a wafer gripper mechanism that performs a wafer centering function. More specifically, it is an object of the invention to provide a wafer gripper mechanism which contacts the edge of a silicon wafer at a plurality of points, the number of contact points being sufficient to avoid sensitivity caused by notches or flat surfaces on the wafer periphery.

It is a further object of the invention to provide a wafer gripper mechanism having a pair of gripping members which are coupled so as to achieve simultaneous opposite linear movement of the gripper elements away from and towards each other.

According to the invention there is provided a wafer gripper assembly comprising a first gripping member having a first gripping face with a plurality of contactor elements thereon; a second gripping member having a second gripping face with a plurality of contactor elements thereon, the second gripping face opposing the first gripping face, wherein the gripping members are movably mounted for linear movement towards and away from each other; and a motor connected to both gripping members by a rotary-to-linear movement translator.

The assembly typically further comprises coupling means that include a rack connected to each gripping member, and a common pinion engaging each rack to produce equal and opposite linear movement in the racks when the pinion is rotated, the motor being connected to the pinion for rotating the pinion.

The assembly preferably includes six contactor elements. These may be distributed to define three contactor elements on each gripping member or two contactor elements on one gripping member, and four contactor elements on the other gripping member.

The contactor elements can include a vertically extending portion having an inwardly facing convex surface for contacting an edge of a wafer, and an inwardly extending flange for supporting a lower surface of the wafer.

Further, according to the invention, there is provided a wafer gripper assembly comprising: a first gripping member; an opposing, second gripping member mounted on a support arm to oppose the first gripping member, the second gripping member being linearly movable towards and away from the first gripping member; and a motor connected to the second gripping member, wherein at least six contactor elements are defined on the gripping members.

BRIEF DESCRIPTION OF THE DRAWINGS

FIG. 1 is a wafer processing robot that includes a pair of wafer gripper assemblies in accordance with the invention;

FIG. 2 is an isometric view of a wafer gripper assembly in accordance with the invention;

FIG. 3 is a schematic representation of a wafer and four gripper contact points;

FIG. 4 is a plan view of the wafer gripper assembly of FIG. 2;

FIG. 5 is a plan view of another embodiment of the wafer gripper assembly showing the gripper assembly in its open state with a wafer located between its gripping members;

FIG. 6 is a plan view of the gripper assembly of FIG. 5 showing the gripping members gripping a silicon wafer;

FIG. 7 is a side view of the gripper assembly and wafer of FIG. 6;

FIG. 8 is a plan view of the gripper assembly of FIG. 5 with the cover of the gripper housing removed;

FIG. 9 is a partially exploded plan view of the assembly of FIG. 8;

FIG. 16 is yet another embodiment of a gripper assembly in accordance with the invention; and FIG. 17 is a schematic plan view of a semiconductor wafer cassette showing the relative locations of the contactor elements of the assembly of FIG. 16.

DETAILED DESCRIPTION OF THE INVENTION

Figure 10:
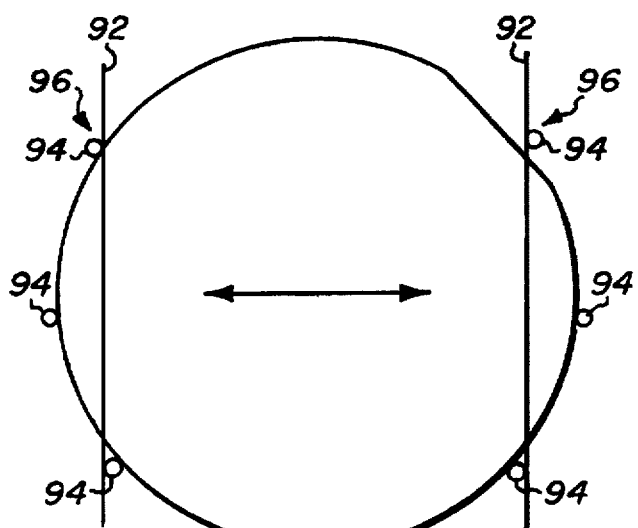
FIG. 10 is a schematic representation of the contactor elements of the gripper assembly of FIG. 5 showing the distribution relative to the constraints provided by a chuck.

For purposes of semiconductor wafer processing it is often essential to accurately center the wafer prior to the performance of some operation. As mentioned above, in the prior art devices this centering operation is typically performed in the process module. The present wafer gripper assembly has been developed to perform the centering operation when the wafer is picked up by the wafer handling robot. This saves space and reduces overall machine complexity. The various embodiments of the invention make use of a plurality of contactor elements. This centers the wafer with a degree of accuracy which exceeds the allowable tolerance on the wafer diameter. Specifically, target centering accuracy for the gripper assembly is better than 0.04 millimeters. Theoretically only three contact points are required to achieve accurate centering of a round wafer. However, the present invention envisages the use of a larger number of contact points. Specifically, at least six contactor elements are used. This has the advantage that the centering operation is insensitive to the location of flat sections or notches on the wafer. The position of the contact points can be optimized for maximum centering accuracy bearing in mind the geometric constraints imposed by either a wafer chuck or a wafer holding cassette.

A further concept applied in a number of the embodiments of the present invention is that of coupled linear motion of the gripping members, which will be described in greater detail below. It essentially comprises the simultaneous movement in opposite directions of both gripping elements to maintain a fixed center point at all times.

FIG. 1 illustrates a wafer handling robot 10 which includes two "fork" grippers 12 in accordance with the invention. As illustrated in FIG. 2, each gripper assembly comprises a pair of gripping members 14, each having a semicircular shape and a linear portion 15 extending into a housing 16. Three contactor elements 18 protrude inwardly from each of the gripping members 14 and serve to support and center a wafer between them. By using a total of six contactor elements, greater centering accuracy of a wafer can be achieved. By way of illustration, FIG. 3 shows a four-contact-point arrangement used in handling a typical wafer. The contact points 19 exert an inward force on the edges of the wafer 20. If the flat portion 21 of the wafer 20 coincides with one of the contact points 19, as shown, a net force is exerted on the wafer 19, as indicated by the arrow 22. This makes the arrangement more susceptible to errors.

FIG. 4 shows the assembly in plan view with the cover of the housing 16 removed. In this embodiment the straight portions 15 of the gripping members are each secured to a rack 23, 24. The racks 23, 24 are coupled to a common pinion 25 that is mounted on an axle extending parallel to the straight portions 15. The rack 23 abuts the pinion 25 from below, while the rack 23 abuts the pinion 25 from above. Rotation of the pinion 25 by means of a motor 26 thus causes linear movement of the portions 15 towards and away from each other by equal and opposite distances. As a result, the geometric center 30 of the silicon wafer 32 gripped by the gripper assembly 12 does not move relative to the housing 16.

FIGS. 5 to 7 illustrate another embodiment of the invention. Once again this a "fork" gripper. FIG. 5 shows the gripper assembly 40 in its open state with a wafer 42 located between its gripping members 44. The gripping members 44 each comprises a plate defining a semicircular section 46. This plate construction provides a sturdier arrangement than the embodiment illustrated in FIG. 4. In order to reduce the weight of the gripping members 44, holes 48 are provided in the plates.

FIG. 6 shows the gripper assembly of FIG. 5 in a gripping state in which the gripping members 44 have been moved together to grip the wafer 42 by means of six contactor elements 50. When viewed from the side, as illustrated in FIG. 7, it is seen that the plates define an elbow 52 at the housing 54 so as to enter the housing 54 near its top. This allows a motor to be mounted with a vertical axle as described in greater detail with reference to FIG. 8.

FIG. 8 shows the gripper assembly 40 with the housing cap of the housing 54, removed. The one gripping member, which for ease of reference will be indicated by reference numeral 56, is connected to a rack 58. The other gripping member 60 is connected to a second rack 62. In this embodiment a vertically extending pinion 64 couples the racks 58, 62 to a common drive motor (not shown) having a vertically extending shaft 68. Once again, rotation of the pinion causes linear movement of the racks in opposite directions, thereby maintaining a fixed geometric center.

FIG. 9 shows a partially exploded view of the assembly of FIG. 8 to, further, expose the drive mechanism of the gripper assembly 40. The gripping member 56 extends into a connector plate 70 which is secured by conventional means to a bearing block 72. The bearing block 72 rides on a bearing track 74 to provide the linear movement mentioned above. In a similar fashion the gripping member 60 extends into a connector plate 76 which is secured by conventional means to a bearing block 78. The bearing block 78 also rides on the bearing track 74. The use of a common track 74 for the two bearing blocks 72, 78, ensures parallel movement of the bearing blocks 72, 78. A return spring 82 is secured with one end to the housing 54 and at its other end to the connector plate 76, as illustrated in FIG. 8. The return spring 82 urges the member 60 to its closed position. Since the members 56, 60 are coupled to one another by means of the pinion 64, the member 56 is clearly also urged to its closed position.

Referring to FIG. 1, the gripper assembly is typically used to transfer a wafer to and from a rotary chuck (not shown). For instance, a wafer is lowered onto a chuck by positioning the wafer over the chuck and lowering the vertically extending robot cylinder 90, thereby positioning the wafer on the chuck. Similarly, the wafer is removed by moving the gripping member in underneath the wafer and lifting the wafer off the chuck. It will be appreciated that, in both cases, the free ends of the gripping members have to clear the chuck. It is therefore essential that the grippers be capable of sufficient linear movement to accommodate the diameter of the chuck. This is illustrated in FIG. 10, in which the lines 92 represent the constraints presented by the chuck. The contactor elements are represented by the circles 94 and, as can be seen from FIG. 10, the contactor elements 96, which are secured near the free ends of the gripping members, are positioned so as to clear the chuck when the gripping members are in their closed state.

Figure 11:
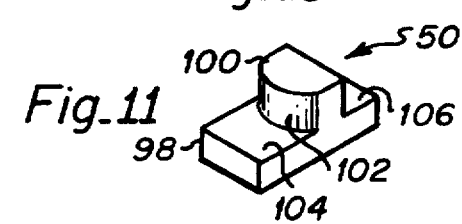
FIG. 11 is an isometric view of a contactor element forming part of the gripper assembly.
Figure 12:
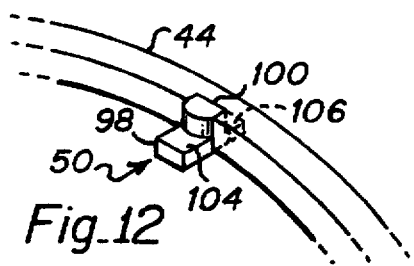
FIG. 12 is an isometric view of a portion of a gripping member showing a contactor element secured thereto.
Figure 13:
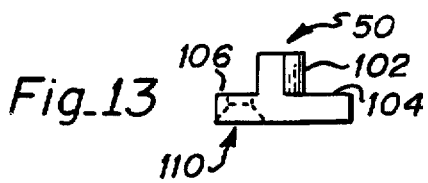
FIG. 13 is a side view of the contactor element of FIG. 11.
Figure 14:
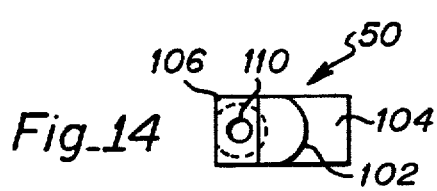
FIG. 14 is a plan view of the contactor element of FIG. 13.

FIG. 11 illustrates a contactor element 50 in greater detail. It comprises a base 98 and an upwardly extending semi-cylindrical portion 100. The semi-cylindrical portion 100 defines a convex surface 102 for contacting the edge of a wafer. The inwardly extending portion 104 of the base 98 constitutes a flange for supporting the lower surface of a wafer, while the outwardly extending portion 106 of the base 98 serves as a securing formation for securing the element 50 to a gripping member as illustrated in FIGS. 12 to 14. As illustrated in FIG. 12, the semicircular portions of the gripping members 44 are provided with recesses for complimentarily receiving the portions 106 and part of the semi-cylindrical portions 100 of the elements 50.

Figure 15:
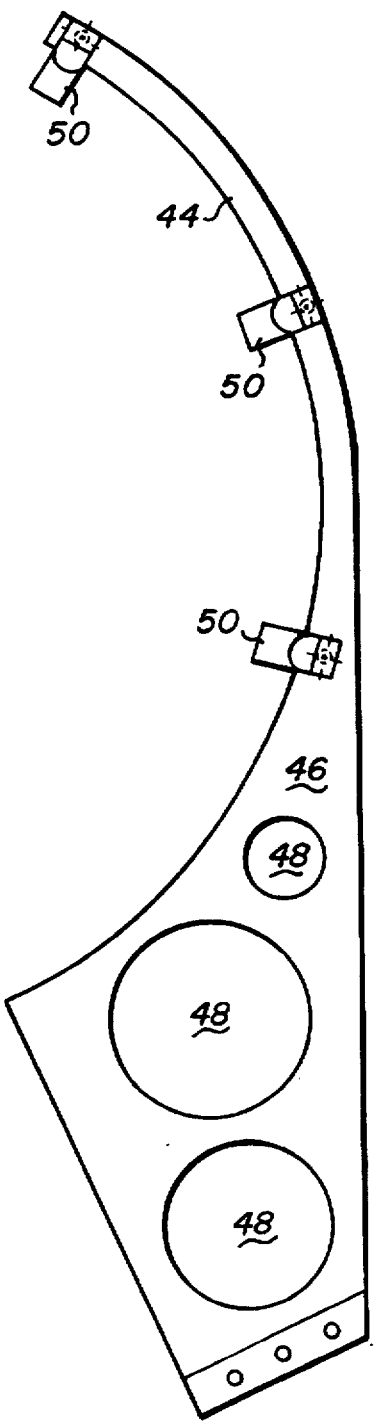
FIG. 15 is a plan view of a gripping member with three contactor elements forming part of the embodiment illustrated in FIG. 5.

FIG. 13 shows the contactor element 50 from the side. A bore 110 extends through the portion 106, as is also illustrated in the plan view of FIG. 14. Using the principle described above, three contactor elements 50 are placed in complimentary recesses in each gripping member 44 so as to extend inwardly as illustrated in FIG. 15. The contactor elements 50 are secured by means of screws (not shown) extending through the portions 106 into the gripping member 44.

FIG. 16 shows another embodiment of a gripper assembly in accordance with the invention. The gripper assembly 200 is referred to as a "tongue" gripper and is used to move wafers into and out of cassettes. The cassette geometry requires that the gripper 200 be sufficiently narrowed to pass into the cassette. Instead of lateral movement, as described for the "fork" gripper of FIGS. 4 to 8, linear movement takes place along the longitudinal axis of the assembly 200. The gripper assembly 200 defines a plate-like first gripping member 202 and a semi-circular second gripping member 204. In one embodiment, the members 202, 204 are moveable relative to the housing 206 so as to be moveable towards and away from each other. This is illustrated in FIG. 17 in which the movement of the two members is indicated by the arrow 208. As with the "fork" gripper, the gripping members 202 and 204 are connected to connector plates (not shown) which connect the members 202, 204 to racks, so as to be moveable by a common pinion (not shown). In another embodiment the gripping member 204 is secured to the housing 206, and only the member 202 moves relative to the housing 206. As mentioned above, the dimensions of the "tongue" gripper have to be such that it can be passed into a wafer cassette. This is illustrated in FIG. 17 in which the contactor elements 210 are indicated by circles. Once again, six contactor elements are provided to accurately center the wafer on the element 202. In the "tongue" gripper of FIGS. 16 and 17, however, the contactor elements are not evenly distributed between the elements 202 and 204. The element 202 provides only two contactor elements 210, while the element 204 has four elements 210 secured thereto. This allows the narrow element 202 to be passed underneath the wafer 212 to the far end 214 of the cassette 216 without interfering with the closely spaced ends 218 of the side walls of the cassette 216. As illustrated in FIG. 17, the fact that the contactor element indicated by reference numeral 220 coincides with the flat surface 222 of the wafer 212, does not interfere with the accurate centering of the wafer.

The embodiments described above are not to be considered as in any way limiting the scope of the invention. It will be appreciated that the invention can be implemented in a variety of ways without departing from the scope of the invention.

We claim:

1. A wafer gripper assembly comprising:

a first gripping member having a first gripping face with a plurality of contactor elements thereon;

a second gripping member having a second gripping face with a plurality of contactor elements thereon, the second gripping face opposing the first gripping face, wherein the gripping members are movably mounted for linear movement towards and away from each other; and a motor connected to both gripping members by a rotary-to-linear movement translator, wherein the assembly includes six contactor elements, and the contactor elements are means for making point contact with the edge of a wafer.

2. A wafer gripper assembly of claim 1 further comprising a coupling means that includes a rack connected to each gripping member, and a common pinion engaging each rack to produce equal and opposite linear movement in the racks when the pinion is rotated, the motor being connected to the pinion for rotating the pinion.

3. A wafer gripper assembly of claim 2 wherein the contactor elements include a vertically extending portion having an inwardly facing convex surface for contacting an edge of a wafer, and an inwardly extending flange for supporting a lower surface of the wafer.

4. A wafer gripper assembly of claim 1, wherein three contactor elements are defined on each gripping member.

5. A wafer gripper assembly of claim 1 wherein four contactor elements are provided on the first gripping member, and two contactor elements are provided on the second gripping member.

6. A wafer gripper assembly comprising:

a first gripping member;

an opposing, second gripping member mounted on a support arm to oppose the first gripping member, the second gripping member being linearly movable towards and away from the first gripping member; and a motor connected to the second gripping member, wherein at least six contactor elements are defined on the gripping members, and the contactor elements are means for making point contact with the edge of a wafer.

7. A wafer gripper assembly of claim 6, wherein two contactor elements are defined on the one gripping member, and four contactor elements are defined on the other gripping member.

8. A wafer gripper assembly of claim 6, wherein the contactor elements include a vertically extending portion having an inwardly facing convex surface for contacting an edge of a wafer, and an inwardly extending flange for supporting a lower surface of the wafer.

* * * * *